United States Patent
Leslie et al.

(10) Patent No.: US 6,640,092 B1
(45) Date of Patent: Oct. 28, 2003

(54) TRANSMITTER

(75) Inventors: Mike Leslie, Meadowbank (AU); Charles Bertelsmeier, Meadowbank (AU)

(73) Assignee: BAE Systems Australia (MBK) Pty Limited, Edinburgh (AU)

(*) Notice: Subject to any disclaimer, the term of this patent is extended or adjusted under 35 U.S.C. 154(b) by 0 days.

(21) Appl. No.: 09/601,338

(22) PCT Filed: Feb. 22, 1999

(86) PCT No.: PCT/AU99/00099

§ 371 (c)(1),
(2), (4) Date: Nov. 2, 2000

(87) PCT Pub. No.: WO99/43092

PCT Pub. Date: Aug. 26, 1999

(30) Foreign Application Priority Data

Feb. 20, 1998 (AU) .............................................. PP 1965

(51) Int. Cl.[7] .............................................. H01Q 11/12
(52) U.S. Cl. ...................... 455/127; 455/126; 455/115; 330/127; 330/297
(58) Field of Search ................................ 455/126, 127, 455/91, 115, 95, 99, 100, 102, 103, 105, 108, 116, 119, 123, 125; 330/127, 129, 285, 296, 297, 149, 10, 104; 375/96, 97

(56) References Cited

U.S. PATENT DOCUMENTS

| | | | |
|---|---|---|---|
| 3,891,926 A | * 6/1975 | Ishman et al. ............... | 455/108 |
| 4,298,841 A | 11/1981 | Dishal ........................ | 328/117 |
| 4,336,615 A | 6/1982 | Abt et al. ................... | 455/108 |
| RE33,333 E | * 9/1990 | Taylor et al. ................. | 330/10 |
| 5,121,077 A | * 6/1992 | McGann ..................... | 330/149 |
| 5,150,072 A | * 9/1992 | Malec ........................ | 330/149 |
| 5,301,363 A | * 4/1994 | Hinderks .................... | 455/101 |
| 5,524,287 A | * 6/1996 | Yokoya et al. ............. | 455/126 |
| 5,661,433 A | * 8/1997 | LaRosa et al. ............. | 329/341 |
| 5,852,769 A | * 12/1998 | Ahmed et al. .............. | 455/115 |
| 5,966,645 A | * 10/1999 | Davis ........................ | 455/108 |
| 6,175,270 B1 | * 1/2001 | Vannucci ....................... | 330/2 |
| 6,285,255 B1 | * 9/2001 | Luu et al. .................... | 330/149 |

OTHER PUBLICATIONS

A. Bateman et al., "Direct Conversion Linear Transceiver Design", Fifth Int. Confer. On Mobile Radio and Personal Comm., London, UK, pp. 53–56, 1989.

B. Wilkinson et al., "Transmitter Linearisation Technique for the 1.5–1.7 GHz MSAT bands", Fifth Int. Confer. On Radio Rec. and Assoc. Systems, London, UK, pp. 173–176, 1990.

* cited by examiner

Primary Examiner—Pablo N. Tran
(74) Attorney, Agent, or Firm—Foley & Lardner

(57) ABSTRACT

A transmitter which comprises a rf carrier signal generator for generating a rf carrier, a Class C amplifier arranged to amplify the rf carrier, a power supply for the Class C amplifier, a detector for detecting the modulated rf carrier and establishing a detected signal, a controller for controlling the power supply, means for supplying an audio signal to the controller for the purpose of amplitude modulating the rf carrier, and wherein the audio signal and the detected signal are applied to the controller to compensate for the non-linearily of the Class C amplifier.

7 Claims, 6 Drawing Sheets

TRANSMITTER

FIELD OF THE INVENTION

This invention relates to a transmitter for use in transmitting an amplitude modulated radio frequency (rf) signal. The invention has been developed for use in a locator beacon which is being made the subject of an independent patent application and the invention is hereinafter described in the context of the locator beacon. However, it will be understood that the invention does have broader applications, to a transmitter for use in any rf communication system.

BACKGROUND OF THE INVENTION

The transmitter has been developed to meet the requirements for a relatively low power demand and this virtually dictates the use of a Class C amplifier stage. However, the traditional problem with a Class C amplifier is that its modulation characteristic is non-linear and introduces distortion and this is incompatible with a requirement for low distortion transmission of audio information.

SUMMARY OF THE INVENTION

The present invention seeks to reconcile these conflicting requirements by providing a transmitter which comprises:

(a) an rf carrier signal generator for generating a rf carrier;
(b) a Class C amplifier arranged to amplify the rf carrier;
(c) a power supply for the Class C amplifier;
(d) a detector for detecting the modulated rf carrier and establishing a detected signal;
(e) a controller for controlling the power supply;
(f) means for supplying an audio signal to the controller for the purpose of amplitude modulating the rf carrier;

and wherein the audio signal and the detected signal are applied to the controller to compensate for the non-linearity of the Class C amplifier.

In a preferred embodiment, amplitude modulation sufficient for transmitting the audio form signal on the rf carrier can be achieved with reduced distortion while maintaining the low power demand advantage of the Class C amplifier.

Preferably, the detector comprises a directional coupler and/or a power detector.

Preferably, the power supply comprises a switch mode power supply.

Advantageously, the controller comprises an amplitude comparison means for performing an amplitude comparison between the audio signal and the detected signal.

In one embodiment, the transmitter further comprises a preamplification means between the rf carrier signal generator and the Class C amplifier for preamplifying the rf carrier.

Preferably, the transmitter further comprises an antenna for transmitting the amplitude modulating rf carrier, the antenna comprising a circuit board which constitutes an active portion of the length of the antenna and on which are mounted electrical components for tuning the antenna.

The invention may be more fully understood from the description of a preferred form of the transmitter provided below in conjunction with the accompanying drawings.

DESCRIPTION OF THE PREFERRED EMBODIMENTS

Figure 1:
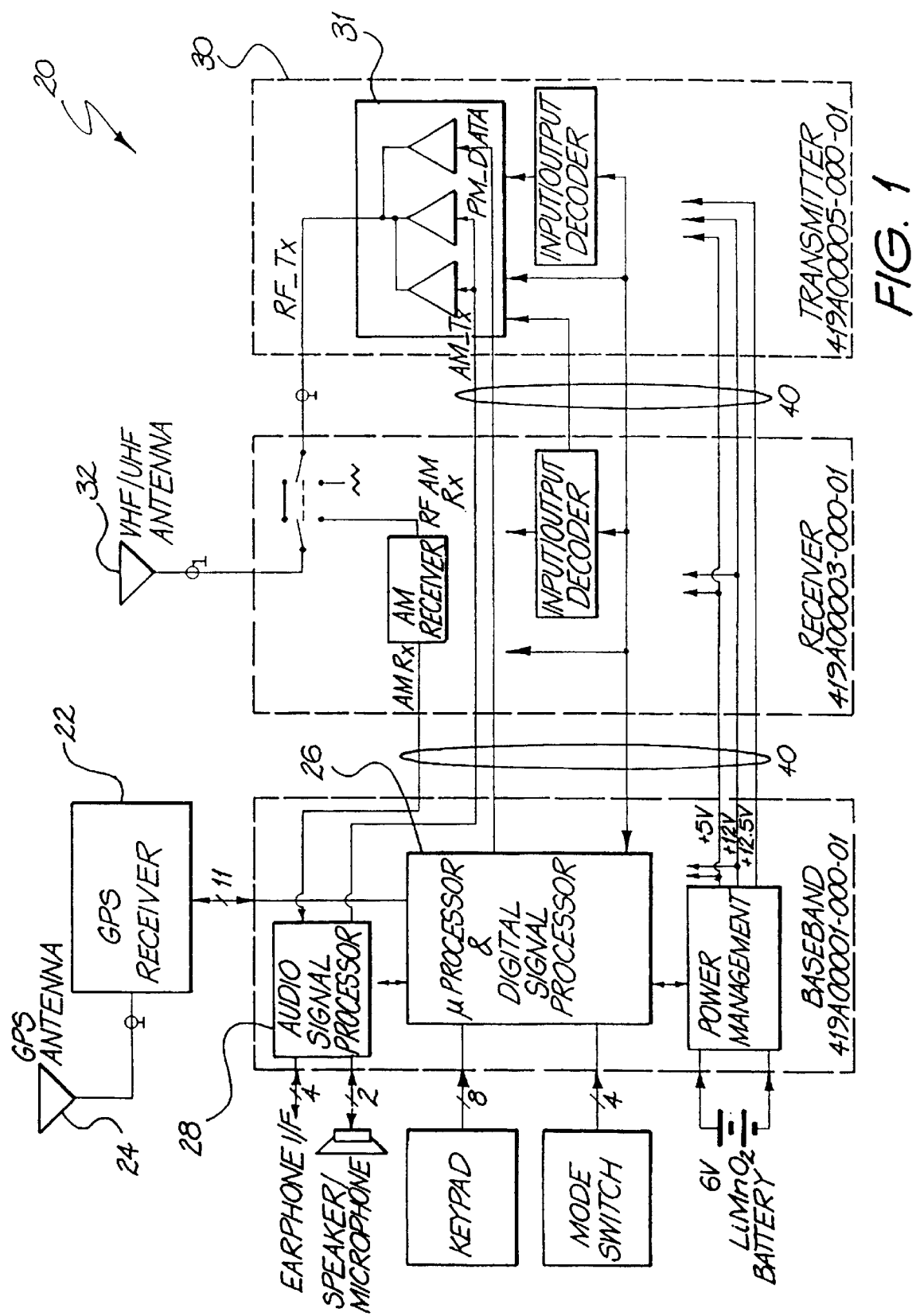
FIG. 1 is a block diagram of a locator beacon.

In FIG. 1 the locator beacon 20 includes a receiver 22 for receiving a global positioning system signal via antenna 24. The receiver 22 is connected to a microprocessor/digital signal processor 26 in which geographical position information contained on the global positioning system signal is converted into a digital signal. The digital signal produced by the microprocessor/digital signal processor 26 is processed by an audio signal processor 28. In the audio signal processor 28 an audio signal corresponding to the geographical position information is generated and send to a transmitter 30 of the locator beacon 20. The transmitter 30 transmits amplified rf signals some of which carry the audio signal (amplification unit 31) via a VHF/UHF antenna 32.

In an emergency situation the locator beacon 20 described above can transmit an audio signal which can communicate in a computer generated voice the geographical position of the locator beacon via radio. The information can be received by conventional rf receivers. This means that a large number of potential searchers is 'accessible' and that those searchers are provided with the geographical position of the individual 'automatically', independent on whether the individual is capable of active communication or not.

Figure 2:
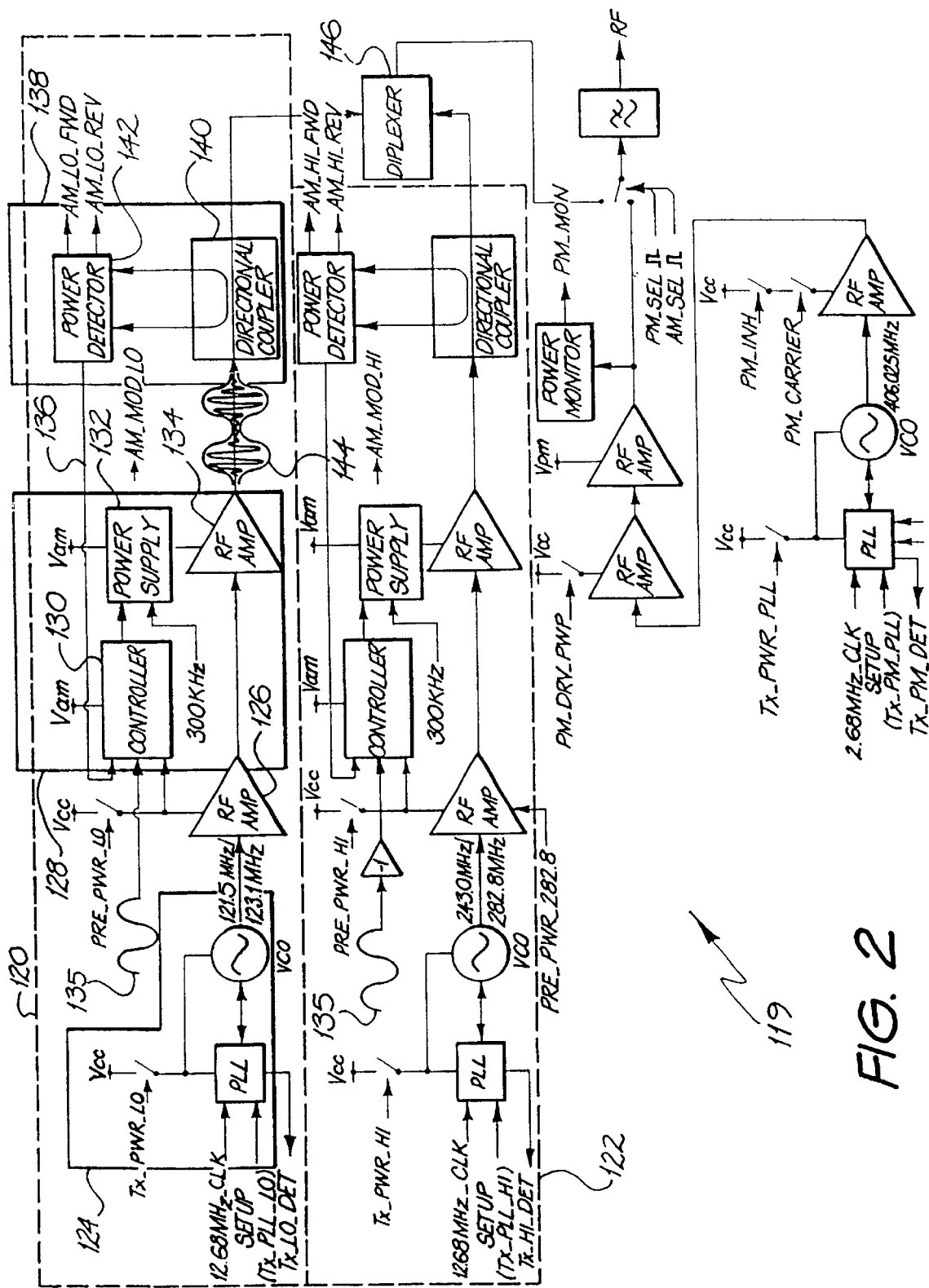
FIG. 2 is a block diagram of a transmitter for use in the locator beacon of FIG. 1.

In FIG. 2 the transmitter 30 includes functional blocks 120 and 122 which transmit the audio signal 135. The functional block 120 includes a rf generator stage 124 which generates a fixed amplitude rf signal which is preamplified in a Class C amplifier 126. The pre-amplified, fixed amplitude rf signal is then sent into a second Class C amplifier 134, which is one component of an amplitude modulation stage 128. The amplitude modulation stage further includes a controller 130 and a switch mode power supply 132. The controller 130 controls the switch mode power supply 132 in a manner so as to vary a driving power supplied to the second Class C amplifier 134 based on the audio signal 135 and a detected signal sent to the controller 130 via feed-back 136. The detected signal is derived from a power detector stage 138 which includes a directional coupler 140 and a power detector 142. The power detector 142 detects the forward power (via directional coupler 140) from the second Class C amplifier 134 and derives the detected signal which is sent to the controller 130 via feed-back 136. Feed-back 136 enables linear amplitude modulation of the rf carrier. Any non-linearity of the modulation characteristic of the second Class C amplifier 134 is compensated for by driving it non-linearly through the switch mode power supply 132 on the basis of an amplitude comparison between the audio signal 135 and the detected signal. Thus, distortion between the audio signal 135 and the amplitude modulated rf signal 144 is reduced.

Functional block 122 is substantially equivalent to functional block 120 only that a different rf carrier is generated and amplitude modulated and the rf output signals of both functional blocks 120 and 122 are transmitted via a diplexer 146 through antenna 40.

Figure 3:
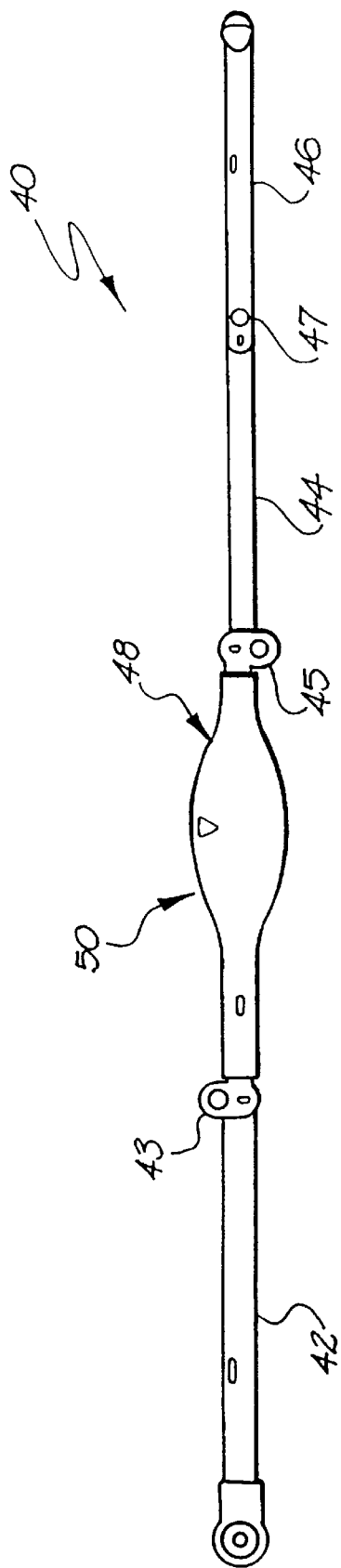
FIG. 3 is a top view of an antenna for use in the locator beacon of FIG. 1.

In FIG. 3 the antenna 40 includes conducting portions 42, 44 and 46 and a non-conductive protection 48 formed over a portion 50 of the antenna 40. The portion 42, 44, 46 and 50 are connected via hinge points 43, 45 and 47.

Figure 4:
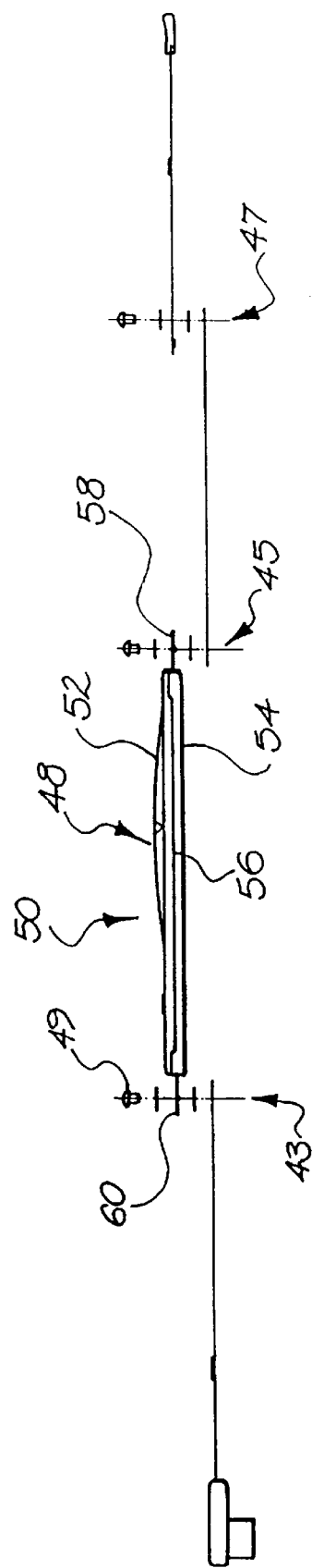
FIG. 4 is an exploded side view of the antenna of FIG. 3.
Figure 5:
FIG. 5 is a schematic top view of a circuit board for use in the antenna of FIG. 3.

In FIG. 4 the non-conductive protection 48 includes two portions 52 and 54 between which a flexible circuit board 56 is enclosed. The flexible board 56 is arranged to make electrical contacts between traces of the circuit (not shown) and two end portions 58 and 60 of the antenna portion 50, both made from the same conducting material as portions 42, 44 and 46 of antenna 40. Pins e.g. 49 are used to connect the portions of the antenna at hinge points 43, 45 and 47. Antenna 40 can be folded as illustrated in FIG. 5.

Figure 6:
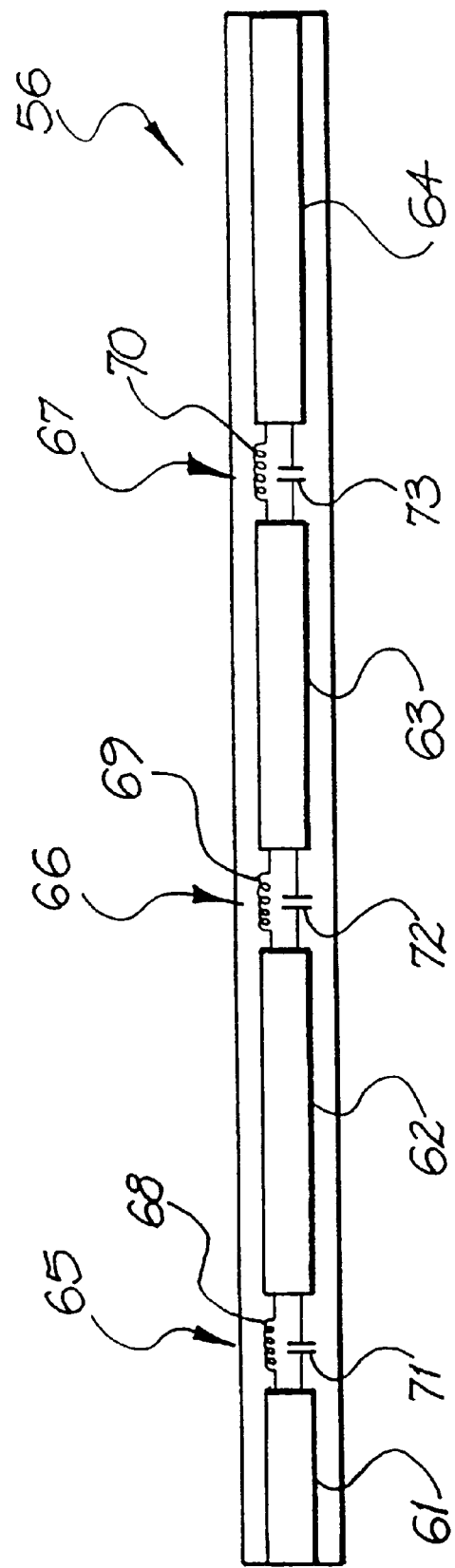
FIG. 6 is a perspective view of the assembled, folded antenna of FIG. 3.

In FIG. 6 the circuit board 56 includes electrically conducting traces 61–64 which are electrically interconnected by LC components 65–67. The LC components 65–67 include in parallel inductances 08–70 and capacitors 71–73. The LC components 65–67 can be formed from circuit elements mounted on substrates which in turn are mounted to the circuit board 56. Alternatively, the circuit elements can be mounted directly to the circuit board 56. It will be appreciated by a person skilled in the art that various other components/traces can be used to tune the antenna 40.

Figure 7:
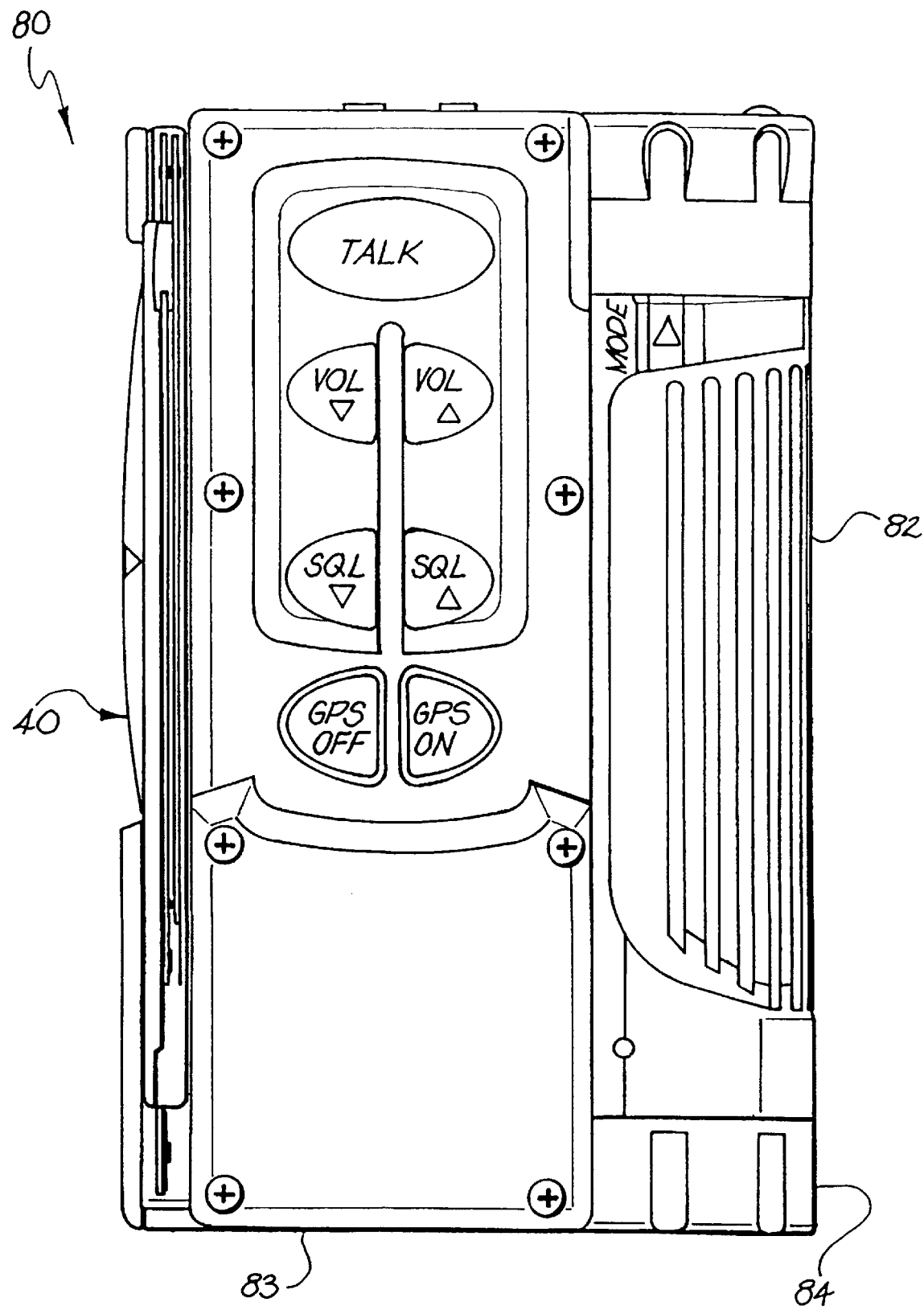
FIG. 7 is a front view of an assembled locator beacon.

FIG. 7 shows a front view of a locator beacon 80 including a battery compartment 82 and antenna 40 (folded). The battery compartment 82 has a cap 84 which sealingly closes the battery compartment 82 when screwed over a battery insertion port of the battery compartment.

Figure 8:
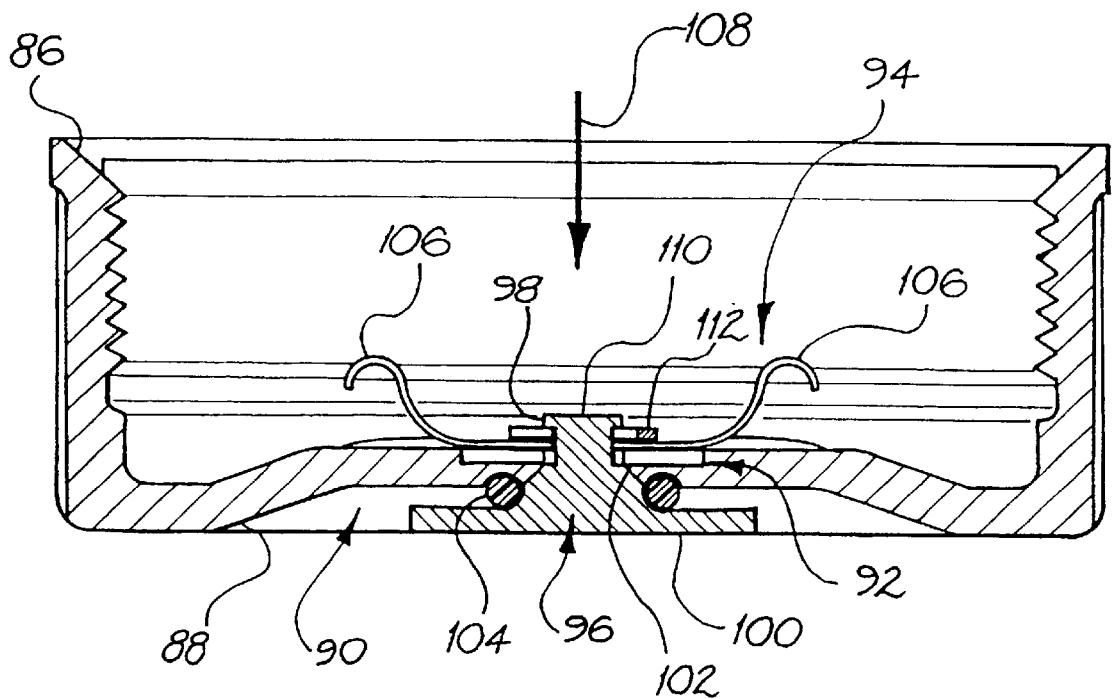
FIG. 8 is a cross-sectional view of a battery compartment cap for use with the locator beacon.
Figure 9:
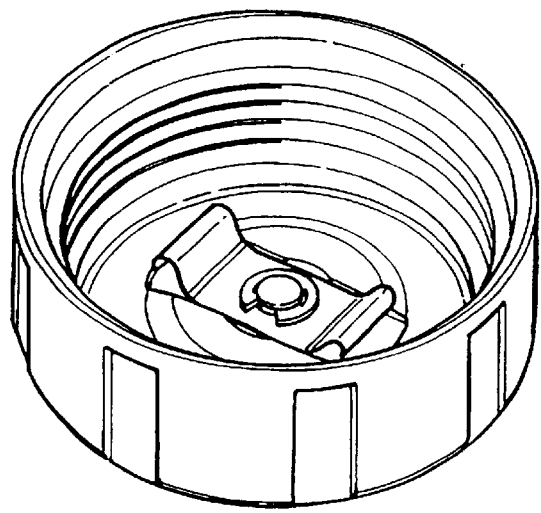
FIG. 9 is a perspective top view of the battery compartment cap of FIG. 8.

In FIG. 8 the metal cap 84 includes a cylindrical wall 86 and a bottom portion 88 which is shaped to form a recess 90 on the outside bottom surface of the cap 84. On the inner surface of the bottom portion 88 a second recess 92 is formed over which sits a resilient metal spring 94. In the centre of the bottom portion 88 there is located a conically shaped hole 96. The wall 98 surrounding the hole 96 tapers towards the outer surface of the bottom portion 88. An insert 100 is inserted through the hole 96 and mounted to the spring 94 utilising clip 112 and in a manner so that when the spring 94 is in a relaxed state a conically shaped portion 102 of the insert 100 abuts the wall 98 and an O-ring 104 disposed between a bottom portion 106 of the insert 100 and the bottom portion 88 of the cap 84. Thereby the hole 96 is sealed.

In use, the upper portion 106 of spring 94 is in electrical contact with one pole of a battery in the battery compartment and forms an electrical connection of the pole to the metal casing 83 of the locator beacon 80. This is achieved through the bottom portion 88 and wall 86 of the battery compartment cap 84, which in use is screwed onto the battery compartment 82 which forms part of the casing 83 (see FIG. 7).

Any gas pressure 108 within the battery compartment 82 acts on the inside walls of the battery compartment, including the top portion 110 of the insert 100. If the internal pressure 108 exceeds a predetermined value, the force on the top portion 110 of insert 100 will result in a deformation of spring 94 into the recess 92 within the bottom portion 88. Thereby, gas contained within the compartment can be released through hole 96 and pass O-ring 104.

It will be appreciated by a person skilled in the art that numerous variations and/or modifications may be made to the present invention as shown in the specific embodiments without departing from the spirit or scope of the invention as broadly described. The present embodiment is, therefore, to be considered in all respects to be illustrative and not restrictive.

What is claimed is:

1. A transmitter which comprises:
    (a) an rt carrier signal generator for generating a rf carrier;
    (b) a Class C amplifier arranged to amplify the rf carrier;
    (c) a power supply for the Class C amplifier;
    (d) a detector for detecting the modulated rf carrier and establishing a detected signal;
    (e) a controller for controlling the power supply;
    (f) means for supplying an audio signal to the controller for the purpose of amplitude modulating the rf carrier;
    and wherein the audio signal and the detected signal are applied to the controller to compensate for the non-linearity of the Class C amplifier.

2. A transmitter as claimed in claim 1 wherein the detector comprises a directional coupler and a power detector.

3. A transmitter as claimed in claim 1 wherein the detector comprises a power detector.

4. A transmitter as claimed in claim 1 wherein the power supply comprises a switch mode power supply.

5. A transmitter as claimed in claim 1 wherein the controller comprises an amplitude comparison means for performing an amplitude comparison between the audio signal and the detected signal.

6. A transmitter as claimed in claim 1 further comprising a preamplification means between the rf carrier signal generator and the Class C amplifier for preamplifying the rf carrier.

7. A transmitter as claimed in claim 1 further comprising an antenna for transmitting the amplitude modulating rf carrier, the antenna comprising a circuit board which constitutes an active portion of the length of the antenna and on which are mounted electrical components for tuning the antenna.

* * * * *